United States Patent
Lecerf et al.

(10) Patent No.: US 10,240,436 B2
(45) Date of Patent: Mar. 26, 2019

(54) METHOD OF TREATING SUBTERRANEAN FORMATION

(71) Applicant: Schlumberger Technology Corporation, Sugar Land, TX (US)

(72) Inventors: Bruno Lecerf, Houston, TX (US); Konstantin Viktorovich Vidma, Novosibirsk (RU); John Daniels, Abu Dhabi (AE)

(73) Assignee: Schlumberger Technology Corporation, Sugar Land, TX (US)

( * ) Notice: Subject to any disclaimer, the term of this patent is extended or adjusted under 35 U.S.C. 154(b) by 1223 days.

(21) Appl. No.: 14/026,230

(22) Filed: Sep. 13, 2013

(65) Prior Publication Data

US 2014/0076544 A1   Mar. 20, 2014

Related U.S. Application Data

(60) Provisional application No. 61/703,435, filed on Sep. 20, 2012.

(51) Int. Cl.
| | |
|---|---|
| *G06G 7/48* | (2006.01) |
| *E21B 41/00* | (2006.01) |
| *E21B 47/00* | (2012.01) |
| *E21B 33/138* | (2006.01) |
| *B33Y 80/00* | (2015.01) |

(52) U.S. Cl.
CPC ........ *E21B 41/0092* (2013.01); *E21B 33/138* (2013.01); *E21B 41/00* (2013.01); *E21B 47/00* (2013.01); *B33Y 80/00* (2014.12)

(58) Field of Classification Search
None
See application file for complete search history.

(56) References Cited

U.S. PATENT DOCUMENTS

| | | | | |
|---|---|---|---|---|
| 4,710,946 A | * | 12/1987 | Hinch ................ | G01N 23/043 250/255 |
| 5,070,457 A | * | 12/1991 | Poulsen ............... | E21B 43/26 166/250.09 |
| 5,330,005 A | | 7/1994 | Card et al. | |
| 5,908,073 A | | 6/1999 | Nguyen et al. | |

(Continued)

OTHER PUBLICATIONS

East, Loyd, et al. "Application of new fracturing technique improves stimulation success for openhole horizontal completions." SPE International Symposium and Exhibition on Formation Damage Control. Society of Petroleum Engineers, 2004.*

(Continued)

*Primary Examiner* — Aniss Chad
*Assistant Examiner* — Nithya J. Moll
(74) *Attorney, Agent, or Firm* — Andrea E. Tran

(57) ABSTRACT

A method of treating a subterranean formation, including obtaining information of a subterranean formation, generating a three-dimensional model of at least a portion of the subterranean formation, and performing an experiment on the three-dimensional model. The three-dimensional model may be constructed by x-ray scanning of a core of the subterranean formation, and by additive manufacturing using the obtained x-ray image. The subterranean formation may be treated using a treatment designed based upon the experiments performed on the three-dimensional model.

16 Claims, 4 Drawing Sheets

(56) References Cited

U.S. PATENT DOCUMENTS

| | | | |
|---|---|---|---|
| 5,979,557 A | 11/1999 | Card et al. | |
| 6,196,318 B1 * | 3/2001 | Gong | E21B 43/25 |
| | | | 166/307 |
| 6,435,277 B1 | 8/2002 | Qu et al. | |
| 6,599,863 B1 | 7/2003 | Palmer et al. | |
| 6,637,517 B2 | 10/2003 | Samuel et al. | |
| 6,667,280 B2 | 12/2003 | Chang et al. | |
| 6,703,352 B2 | 3/2004 | Dahayanake et al. | |
| 6,837,309 B2 | 1/2005 | Boney et al. | |
| 6,877,560 B2 | 4/2005 | Nguyen et al. | |
| 6,928,399 B1 | 8/2005 | Watts, III et al. | |
| 7,066,260 B2 | 6/2006 | Sullivan et al. | |
| 7,086,460 B2 | 8/2006 | Nguyen | |
| 7,115,546 B2 | 10/2006 | Qu et al. | |
| 7,144,844 B2 | 12/2006 | Qu et al. | |
| 7,219,731 B2 | 5/2007 | Sullivan et al. | |
| 7,220,709 B1 | 5/2007 | Qu et al. | |
| 7,237,610 B1 | 7/2007 | Saini et al. | |
| 7,350,572 B2 | 4/2008 | Fredd et al. | |
| 7,380,600 B2 | 6/2008 | Willberg et al. | |
| 7,398,826 B2 | 7/2008 | Hoefer et al. | |
| 7,413,017 B2 | 8/2008 | Nguyen et al. | |
| 7,482,311 B2 | 1/2009 | Willberg et al. | |
| 7,506,689 B2 | 3/2009 | Surjaatmadja et al. | |
| 7,510,009 B2 | 3/2009 | Cawiezel et al. | |
| 7,550,413 B2 | 6/2009 | Huang et al. | |
| 7,565,929 B2 | 7/2009 | Bustos et al. | |
| 7,666,821 B2 | 2/2010 | Fu | |
| 7,908,230 B2 * | 3/2011 | Bailey | E21B 43/26 |
| | | | 706/13 |
| 7,925,482 B2 * | 4/2011 | Kennon | G01V 1/301 |
| | | | 367/72 |
| 2003/0225521 A1 | 12/2003 | Panga et al. | |
| 2005/0284637 A1 * | 12/2005 | Stegent | C09K 8/5758 |
| | | | 166/308.1 |
| 2006/0054324 A1 | 3/2006 | Sullivan et al. | |
| 2006/0113077 A1 | 6/2006 | Willberg et al. | |
| 2007/0272407 A1 * | 11/2007 | Lehman | E21B 43/26 |
| | | | 166/250.1 |
| 2008/0000639 A1 | 1/2008 | Clark et al. | |
| 2008/0081771 A1 * | 4/2008 | Lin | C09K 8/536 |
| | | | 507/202 |
| 2008/0161212 A1 | 7/2008 | Welton et al. | |
| 2008/0183451 A1 | 7/2008 | Weng et al. | |
| 2011/0188347 A1 | 8/2011 | Thiercelin et al. | |
| 2012/0185225 A1 | 7/2012 | Onda et al. | |
| 2014/0019053 A1 * | 1/2014 | de Prisco | G06T 17/05 |
| | | | 702/12 |

OTHER PUBLICATIONS

Gibson, et al., "Chapter 7: Printing Processes", Additive Manufacturing Technologies: Rapid Prototyping to Direct Digital Manufacturing, Springer Science + Business Media, LLC, New York, NY, 2010; pp. 171-203.

Potapenko, et al., "Barnett Shale Refracture Stimulations Using a Novel Diversion Technique", SPE 119636—SPE Hydraulic Fracturing Technology Conference, The Woodlands, Texas, Jan. 19-21, 2009; 11 pages.

International Search Report and Written Opinion issued in PCT/US2013/059926 dated Dec. 12, 2013; 13 pages.

First Examination Report issued in related GCC application GC2013-25413 dated Jul. 18, 2016, 4 pages.

* cited by examiner

METHOD OF TREATING SUBTERRANEAN FORMATION

This application claims the benefit of U.S. Provisional Application Ser. No. 61/703,435 filed Sep. 20, 2012 entitled "Method of Treating Subterranean Formation" to Lecerf et al., the disclosure of which is incorporated by reference herein in its entirety.

BACKGROUND

This disclosure generally relates to treatment of oil and gas reservoirs.

Hydrocarbons (e.g., oil, condensate and gas) may be produced from wells that are drilled into the formations containing them. For a variety of reasons, for example inherently low permeability of the reservoirs or damage to the formation caused by drilling and completion of the well, the flow of hydrocarbons into the well may be low. In this case, the well may be "stimulated" using, for example, hydraulic fracturing, matrix acidizing, or a combination thereof.

During matrix acidizing, which may also be known as acidizing, matrix acidizing, and so on under certain circumstances, acid or some other reactive chemical is pumped into the formation to react with the material (matrix) of the reservoir to increase its porosity, permeability and contact surface. Acid typically etches the formation creating a network of multiple channels contacting the wellbore. The etched channels may be known as wormholes.

During and/or in between the stages of acidizing, a product known as MAXCO$_3$ ACID, which provides plugging and isolation of naturally occurred wormholes or small wormholes during the stimulation in order to divert a network of wormholes created during the stimulation, may be used. Plugging is achieved by pumping of a solid-laden slurry, for example containing viscoelastic diverting acid (VDA) and fibers or other solids. Information of these and other acidizing products can be found from U.S. Pat. Nos. 7,565,929, 7,380,600, 7,350,572, 7,219,731, 7,666,821, and 6,637,517, the contents of which are hereby incorporated by reference into the current disclosure in their entireties.

After the acidizing, the well is then changed into a production or injection mode. Wells that have undergone matrix acidizing in the past may include regions with large heterogeneities, and future efficient use of the well may be contingent on proper diversion, for example, by bridging or plugging the wormholes and properly addressing the heterogeneities.

Specifically, mathematical models may be built to design a treatment aimed at plugging or bridging particular regions. Known models and treatments are imperfect, however, as there has been a difficulty accurately and appropriately mapping region, especially previously stimulated regions. Specifically, models that utilize straight slot geometries to represent open channels often offer an inaccurate approximation, especially when multiple, wide heterogeneities are present in a formation or a sample thereof.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

The statements made herein merely provide information related to the present disclosure, and may describe some embodiments illustrating the subject matter of this application.

In a first aspect, a method is disclosed. The method includes obtaining information of a subterranean formation, constructing, based upon the obtained information, a three-dimensional model of at least a portion of the formation, and performing an experiment on the model to thereby simulate a treatment plan for the formation.

In a second aspect, a method is disclosed. The method includes obtaining information of a subterranean formation, constructing, based upon the obtained information, a three-dimensional model of a least a portion of the formation, designing a treatment plan for the subterranean formation including performing an experiment on the model of the formation, and applying the treatment plan to the formation.

In a third aspect, a method is disclosed. The method includes obtaining information of a subterranean formation, constructing, based upon the obtained information, a three-dimensional model of a least a portion of the formation, designing a treatment plan for the subterranean formation including performing an experiment on the model of the formation, adjusting the treatment plan based upon results of the performed experiment, and applying the treatment plan to the formation.

DETAILED DESCRIPTION

Figure 1:
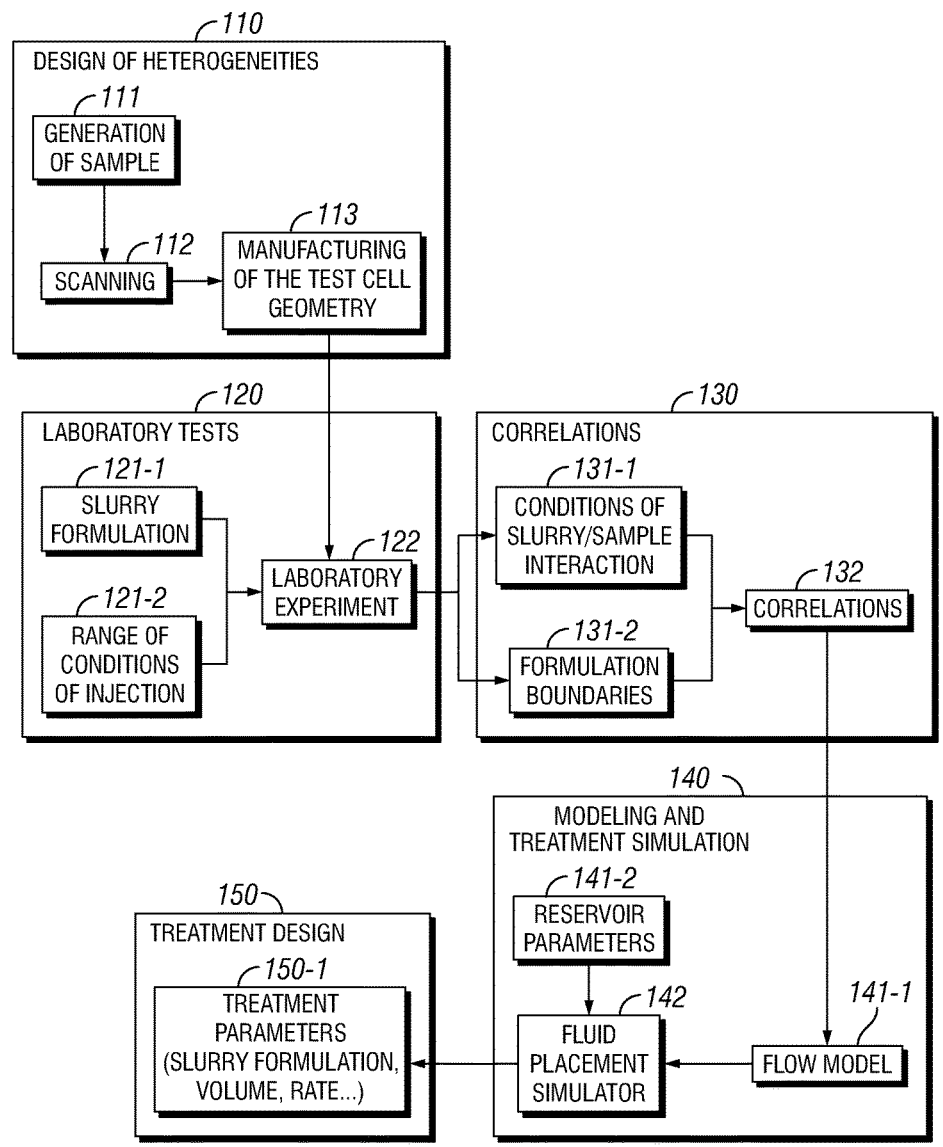
FIG. 1 is a chart showing the processes of design, testing, and modeling in accordance with one or more embodiments.

In the following description, numerous details are set forth to provide an understanding of the present disclosure. However, it may be understood by those skilled in the art that the methods of the present disclosure may be practiced without these details and that numerous variations or modifications from the described embodiments may be possible.

At the outset, it should be noted that in the development of any such actual embodiment, numerous implementation-specific decisions may be made to achieve the developer's specific goals, such as compliance with system related and business related constraints, which will vary from one implementation to another. Moreover, it will be appreciated that such a development effort might be complex and time consuming but would nevertheless be a routine undertaking for those of ordinary skill in the art having the benefit of this disclosure. In addition, the composition used/disclosed herein can also comprise some components other than those cited. In the summary and this detailed description, each numerical value should be read once as modified by the term "about" (unless already expressly so modified), and then read again as not so modified unless otherwise indicated in context. Also, in the summary and this detailed description, it should be understood that a range listed or described as being useful, suitable, or the like, is intended to include support for any conceivable sub-range within the range at least because every point within the range, including the end points, is to be considered as having been stated. For example, "a range of from 1 to 10" is to be read as indicating each possible number along the continuum between about 1 and about 10. Furthermore, one or more of the data points in the present examples may be combined together, or may be combined with one of the data points in the specification to create a range, and thus include each possible value or number within this range. Thus, (1) even if numerous specific data points within the range are explicitly identified, (2) even if reference is made to a few specific data points within the range, or (3) even when no data points within the range are explicitly identified, it is to be understood (i) that the inventors appreciate and understand that any conceivable data point within the range is to be considered to have been specified, and (ii) that the inventors possessed knowledge of the entire range, each conceivable sub-range within the range, and each conceivable point within the range. Furthermore, the subject matter of this application illustratively disclosed herein suitably may be practiced in the absence of any element(s) that are not specifically disclosed herein.

Throughout this description, each numerical value should be read once as modified by the term "about" (unless already expressly so modified), and then read again as not so modified unless otherwise indicated in context.

The following definitions are provided in order to aid those skilled in the art in understanding the detailed description.

The term "fracturing" refers to the process and methods of breaking down a geological formation and creating a fracture, i.e., the rock formation around a well bore, by pumping at very high pressures, in order to increase production rates from a hydrocarbon reservoir. The fracturing methods otherwise use techniques known in the art.

The term "matrix acidizing" refers to a process where treatments of acid or other reactive chemicals are pumped into the formation at a pressure below which a fracture can be created. The matrix acidizing methods otherwise use techniques known in the art.

The term "bridging" refers to plugging of wormholes, or more generally of any pore spaces or fluid paths in a rock formation, or to otherwise make a restriction in a wellbore or annulus. A bridge may be partial or total.

The term "wormhole" refers to a large, empty channel that can penetrate several feet into the formation, often caused by the non-uniform dissolution of limestone or dolomite by hydrochloric acid. Wormholes are created during matrix stimulation or acid fracturing of carbonate formations.

The term "heterogeneity" refers to the quality of variation in rock properties in a reservoir or formation. Shale gas reservoirs are heterogeneous formations whose mineralogy, organic content, natural fractures, and other properties vary from place to place. Heterogeneities may be formed upon, for example, matrix acidizing.

A method for treating a subterranean formation is disclosed herewith. The following is a general summation of an embodiment of the method for treating the subterranean formation. This summation should not be construed as limiting the scope of the subject matter disclosed herein.

The method of this embodiment works to design a treatment plan for a subterranean formation. The treatment plan may be a plan for bridging and/or plugging wormholes with a solid-laden slurry for the purposes of diversion from a network of previously created wormholes.

For example, the method may commence by obtaining information of a subterranean formation. The information may be obtained by acquiring a core sample from an actual formation. The actual formation (and, by extension, the core sample), may or may not have been subjected to a previous treatment, such as an acidizing treatment or a fracturing treatment.

Once the core sample has been acquired, core flood experiments may be performed to obtain particular information of the core sample. The core flood experiments may allow for realistic heterogeneities to be created within the core sample. The core flood experiments may utilize parameters that mimic the downhole conditions of the subterranean formation from which the sample was acquired. The core flood experiments may further involve an acid treatment to open channels and create particular heterogeneities that may mimic the downhole conditions of an acidized subterranean formation.

After any preliminary experiments have been run on the core sample to accurately recreate downhole conditions in the core sample, the cores may be scanned with an X-ray to obtain a three-dimensional representation of the wormhole structure. The X-ray scanning may be computed tomography (CT) scanning, and may produce slice images of the sample. The slice images may be combined to create a three-dimensional picture of the image, which can then be processed to generate a three-dimensional model of the sample, and particularly the wormhole network within the sample.

Once the three-dimensional model is generated, it can be inserted into bridging equipment and bridging experiments can be performed on the three-dimensional model. The results of the bridging experiments may obtain results relating to the amount of solid or fiber and the fluid velocity that will provide for an accurate representation of a desirable treatment for the subterranean formation from which the sample was taken. The results of the experiments may be further used to determine an optimal treatment to be performed on the subterranean formation.

The following describes additional embodiments of the described subject matter, with particular reference to the Figures.

Figure 2:
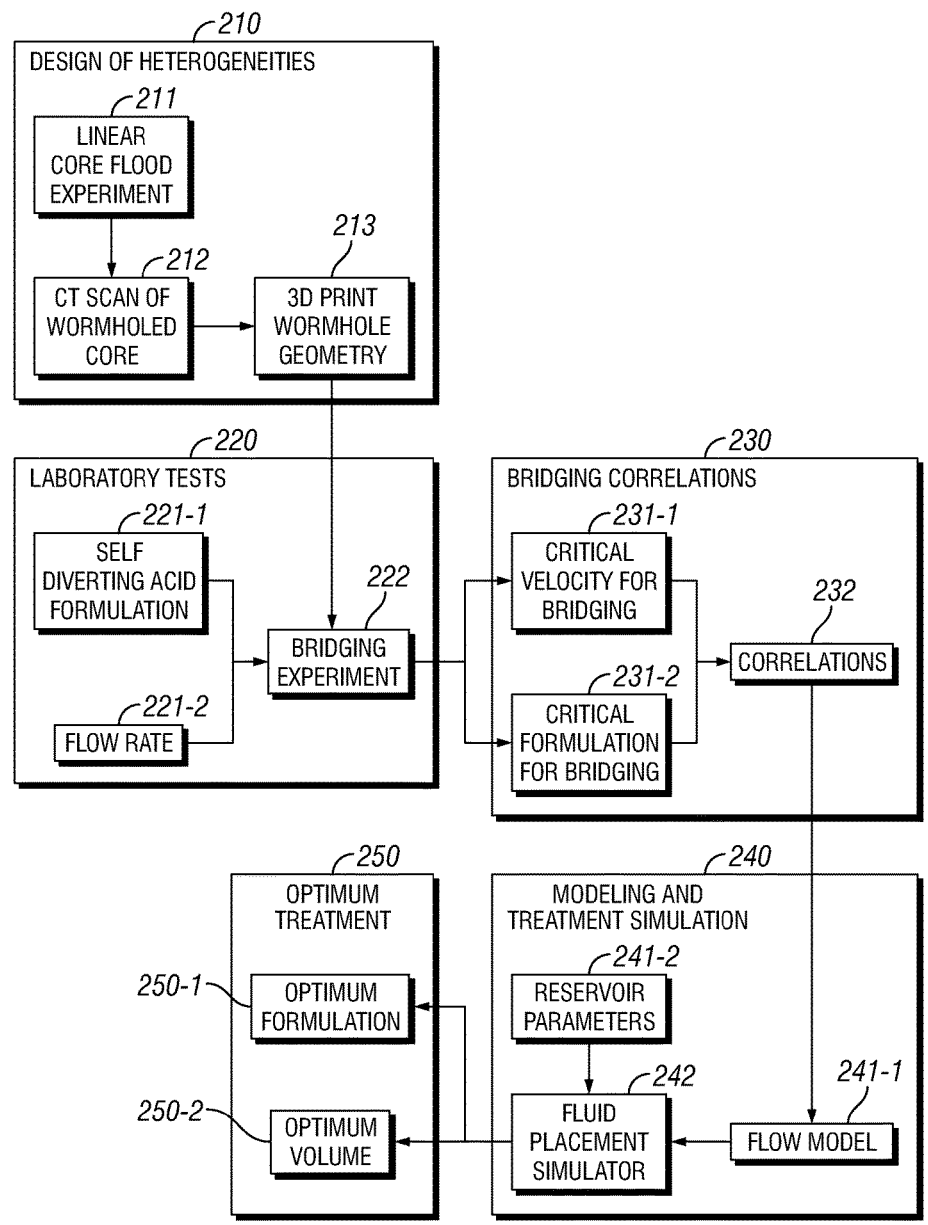
FIG. 2 is a chart showing the processes of design, testing, and modeling in accordance with another one or more embodiments.

Referring to FIGS. 1 and 2, in some embodiments, heterogeneities may be designed as shown in 110 and 210. To design the heterogeneities, a sample may be acquired from a subterranean formation as shown in 111.

In some embodiments, the subterranean formation has not been previously subjected to a treatment, for example, matrix acidizing or hydraulic fracturing, after drilling but prior to obtaining any subterranean information. In some embodiments, the formation has been previously subjected to a treatment after drilling but prior to obtaining any subterranean formation.

The sample may be obtained directly from a subterranean formation, by extraction during drilling or the like, or may be a sample that may be similar in structure or function to a particular portion of a subterranean formation. It should also be noted that though a particular embodiment relates to designing a treatment for a subterranean formation, one skilled in the art would understand that the techniques employed herein can be used to design a treatment for any particular structure from which a sample is generated, analyzed and otherwise tested by the system and methods described herein.

In some embodiments, the sample may have a length of 0.5 to 15 inches, or about 2-6 inches. The sample may be a cylindrical sample, or may have a non-cylindrical shape. The diameter or thickness of the sample may be from 0.2 to 3 inches, or about 1-1.5 inches.

In embodiments where the formation has not been previously subjected to a treatment after drilling, the sample itself may also not have been subjected to a fluid or a condition simulating a pre-existing treatment or condition of the formation after the drilling of a wellbore penetrating the formation. In embodiments where the formation has been previously subjected to a treatment after drilling, the sample itself may have been subjected to a fluid or condition simulating a pre-existing treatment or condition of the formation after the drilling of a wellbore penetrating the formation.

After obtaining a sample, further information relating to the formation can be acquired. In some embodiments, the derived formation information includes information relating to heterogeneities induced within the sample. Heterogeneities may be a fracture induced by a stimulation treatment or a wormhole induced by a matrix treatment. In some embodiments, the wormholes and resultant large heterogeneities may be present based upon a previous treatment that the sample was subjected to. In some embodiments, the heterogeneities may be present based upon the structure of the sample itself.

To further acquire formation information, which may include understanding and deriving relevant geometries of heterogeneities, one or more linear core flood experiments can be performed on the core sample, as shown in 211. In order to design the relevant geometries, a series of experiments may be run with parameters reproducing the design parameters of an initial treatment. The shape and size of the wormholes may vary. Some factors that may allow for variation in the shape and size of the heterogeneities include the type of rocks, and experimental parameters such as flow rate, temperature, and the type of fluid used. In some embodiments, the parameters to be selected are parameters that mimic downhole conditions of a primary acidizing treatment that had been performed on the sample. The core flood experiments may further include acidizing of the core sample while accounting for, in whole or in part, the parameters described above. The core flood experiments may yield samples of acidized carbonate cores with one or more wormholes and presenting particular heterogeneities, which may be wide and numerous. The acidized cores and heterogeneities present within may be studied and utilized for designing an accurate diversion treatment relying on bridging and plugging of solid agents.

In some embodiments, the sample can be scanned as shown in 112. The scanning of the sample may allow for particular formation information to be derived. In some embodiments, the formation information is derived by X-ray scanning of the sample of the formation. The design of heterogeneities 210 may involve a computed tomography (CT) scan of a wormholed core 212.

The X-ray scanning may utilize a high resolution X-ray which may allow for a three-dimensional representation of the wormhole structure. The method of X-ray scanning may be by computed tomography, and slice images of the sample may be produced. Further, a three-dimensional image can be obtained by image processing, including reconstructing, segmenting and transforming the slice images.

The image processing may be performed by an image processing software package, including the CT Analyzer from Skyscan or Avizo Fire.

In some embodiments, the formation information may be derived from laser profilometry, which is a technique to characterize topography of surfaces. One skilled in the art would understand the adaptability of laser profilometry to characterize the topography of particular portions, including the walls of a fracture, of a sample of a subterranean formation.

In 113, test cell geometries can be manufactured and a model can be developed based upon the generated formation information. In some embodiments, the model is a three-dimensional model of a portion of the formation. The model can be obtained via an additive manufacturing process. A disclosure of additive manufacturing may be found in "Additive Manufacturing Technologies, Rapid Prototyping to Direct Digital Manufacturing," Ian Gibson, David Rosen et. al., the entire contents of which is incorporated herein by reference. In some embodiments, the additive manufacturing process is accomplished by using a three-dimensional printing device. One particular printing device that may be used in some embodiments is the POLYJET printing device, and related materials and technologies.

The three-dimensional printing device used to generate the three-dimensional model may use ink-jet technology and UV curable materials. The combination of the ink-jet technology and the UV curable materials can efficiently produce detailed and accurate physical prototypes. The process involves printing multiple layers overlaid on top of each other to generate a three-dimensional model. Each printed layer may be a few microns in thickness.

The model can be a model that includes wormhole geometries as shown in 213 of FIG. 2, so as to accurately model heterogeneities from the core sample. The modeling technique may allow for the generated heterogeneities to be scaled up or down as needed. For example, a new three-dimensional model can be generated with variously scaled heterogeneities based upon the same sample and the same three-dimensional images. Such scaling may allow for bridging flow experiments to be performed on various scales of the same wormhole, without affecting or destroying the actual sample.

Further, the model and the sample itself can be manipulated to allow for experiments to be performed by varying, for example, the shape, the size, and the tortuosity of heterogeneities. In some embodiments, the three-dimensional images can be modified and manipulated to allow for generation of a modified three-dimensional model.

After the design of the three-dimensional model, laboratory tests can be performed, for example as shown in 120 and 220. In 121-1 and 121-2, tests may be performed in preparation for an experiment. The laboratory tests may allow for particular characteristics to be advantageously studied in an ensuing laboratory experiment. Such laboratory tests may be instrumental in designing an optimal treatment for a subterranean formation. Such laboratory tests may involve measuring parameters of a slurry, or determining a range of injection conditions. In some embodiments, the results of the laboratory tests may be incorporated into correlations that will be used in the ultimately designed treatment.

The slurry to be measured and used in the described treatments and simulations may be a solid-laden slurry. The solid may further be a fiber. Additionally, the slurry may be entirely fluid. The fluid may be a fluid with a Bingham rheology.

In other embodiments, the laboratory tests can involve studying the formulation of self-diverting acid 221-1 or flow rate 221-2, for example, the flow rate of a slurry. The results of these tests can be used in concert with the generated three-dimensional model so as to perform an experiment on the three-dimensional model.

During a stimulation of a subterranean formation, during pumping of the solid-laden slurry, the slurry enters the network of wormholes and propagates into the primary and adjacent wormholes. While propagating along the primary wormhole, the velocity of the slurry decreases due to leaking into adjacent wormholes, and/or the velocity slows down as the fluid propagates pseudo-radially from the wellbore.

Also, as the fluid travels away from the wellbore, the concentration of solid increases due to fluid reaction with the formation and fluid loss into the formation. The processes may lead to some conditions that promote bridging. On one side, the slurry velocity may decrease and the slowdown of the fluid leads to favored bridging; on the other side, the concentration of solid may increase as the fluid travels down the wormhole. Such a combined effect will result in immobilization of the solid.

These effects that occur in a stimulation of a subterranean formation can be incorporated into the modeling of the subterranean formation, in combination with correlations derived from laboratory experiments, to optimize a treatment.

Once the three-dimensional model including the realistic heterogeneities and/or wormholes is generated, a laboratory experiment can be run on the three-dimensional model as shown in 122. In some embodiments, the laboratory experiment may be a bridging experiment 222 that involves plugging at least a portion of the three-dimensional model. The experiment may further involve applying pressure on a plug or otherwise any experiment to determine whether a plug will succeed under realistic conditions. In an experiment where pressure is applied to a plug, the pressure required to dislodge the plug from the tested portion of the three-dimensional model can be measured.

According to some embodiments, parameters may be derived from the laboratory experiments and can be used to design a treatment to bridge and/or plug particular regions of a subterranean formation.

The experiment may occur by placing the printed three-dimensional model into bridging equipment. The experiment may test a particular amount of solid required to bridge over a wormhole at various fluid rates. The experiment may alternatively involve placing a fluid with a Bingham rheology in the printed three-dimensional model, and determining the pressure required to dislodge the fluid out of the heterogeneities.

The bridging experiment may allow for particular correlations and conditions to be studied, as shown in 130 and 230. The conditions may include particular conditions of the slurry and its interaction with the model 131-1. The laboratory experiment may also allow for studying of boundaries of the formulation 131-2.

In an experiment where a particular amount of solid is measured, the experiment may involve obtaining correlations 132 and 232 which can be denoted by curves relating the particular amount of solid and the fluid velocity on the wormholes within the three-dimensional model. The curves may be estimated by regression of an equation such as the equation listed below and described in SPE 119636, the content of which is hereby incorporated by reference:

$$\bar{\phi} = const \cdot w^\alpha u^\beta \mu^\gamma$$

where $\Phi$ is the minimal concentration of fiber material required for bridging: w the effective fracture width, u the fluid velocity, and u the fluid viscosity at given shear rate. Parameters $\alpha$, $\beta$, $\gamma$ are constants obtained by regression of the data from the laboratory experiments. Respectively, they are functions of the shape, the mechanical properties of the bridging material, and nature and the formulation of the base fluid. The ultimately calculated correlations 132 and 232 may include determining a velocity for bridging 231-1 and a formulation for bridging 231-2. The correlations can then be used to prepare a treatment as shown in 140 and 240.

Figure 3:
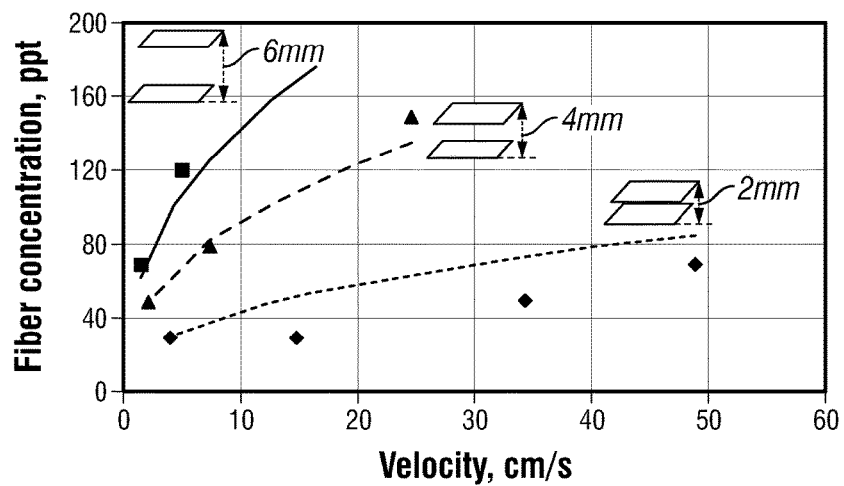
FIG. 3 shows a graph of velocity versus fiber concentration in accordance with one or more embodiments.

Typical curves resulting from such experimental program are reproduced in FIG. 3. It is remarkable that at lower rate of injection, less fiber is required to bridge over a heterogeneity. This observed trend may be utilized when scaling up the laboratory experimental results in order to optimize the formulation and volumes of solid-laden slurry required to generate fluid diversion in the actual treatment.

In order to use the bridging experiments to design an optimal treatment for the subterranean formation, modeling and treatments are simulated as shown in 140 and 240.

In some embodiments, based upon the results of the bridging experiment, a mathematical flow model 141-1 and 241-1 is built to track the velocity field of the fluid in the formation, and the concentration of fibers at a distance from the wellbore. The flow model takes into account calculated or otherwise understood parameters of a reservoir 141-2 and 241-2. The model may further take into account the velocity field of the fluid in the formation, and the concentration of fibers. The mathematical model may account for the facts that in a typical subterranean formation, when propagating along a primary wormhole, velocity of the slurry decreases due to leaking into adjacent wormholes and/or velocity slow-down as the fluid propagates pseudo-radially from the wellbore. The mathematical model may be able to determine the exact location of the onset of bridging.

To design, determine and optimize the treatment 150 for the subterranean formation and the parameters 150-1 associated with the treatment, description with reference to the three-dimensional model and treatment is described. While the following description refers to a solid-laden slurry, one skilled in the art would understand that utilizing a solid-laden slurry is not a limitation of this description, and other slurries including a slurry with a Bingham rheology may be used.

Based upon the mathematical model resulting from the laboratory experiment, further simulations on the three-dimensional model may be run. For example, the treatment can be optimized as shown in 250, 250-1 and 250-2, by running simulations where solid concentrations can be varied, injection rate can be varied, and sensitivity to heterogeneity size and number can be varied. The treatment may be designed to achieve particular acceptable solid loading concentrations, injection rates and slurry volumes which generate diversion.

The following description relates to the optimal treatment that may be designed as a result of the above-described features.

Figure 4:
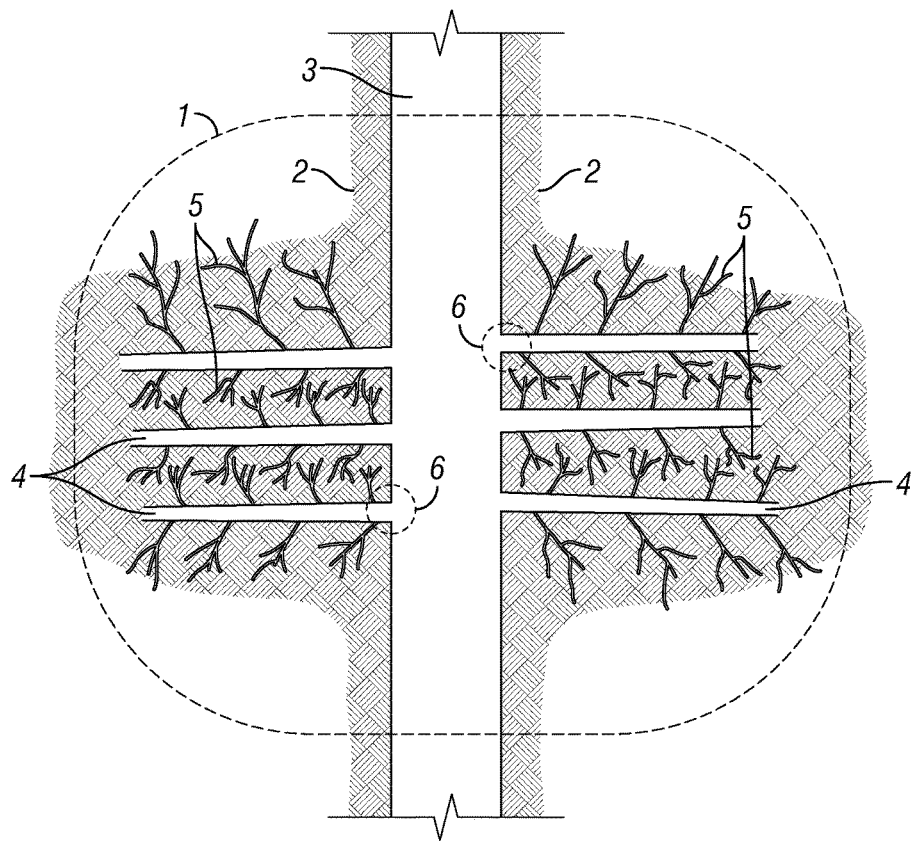
FIG. 4 is a pictorial representation of a stimulated zone in accordance with one or more embodiments.

Referring to FIG. 4, a the schematic example of the structure of a zone 1 in a carbonate reservoir 2 stimulated by matrix acidizing is shown. In an optimally designed treatment, acid creates a network of wormholes consisting of primary wormholes 4 and secondary, tertiary, etc., wormholes 5. Primary wormholes have a contact with a wellbore in the regions 6. In perforated cased wellbores, such contact occurs at the perforation channels. In some embodiments, the primary wormholes have diameter of 8-25 mm.

Figure 5:
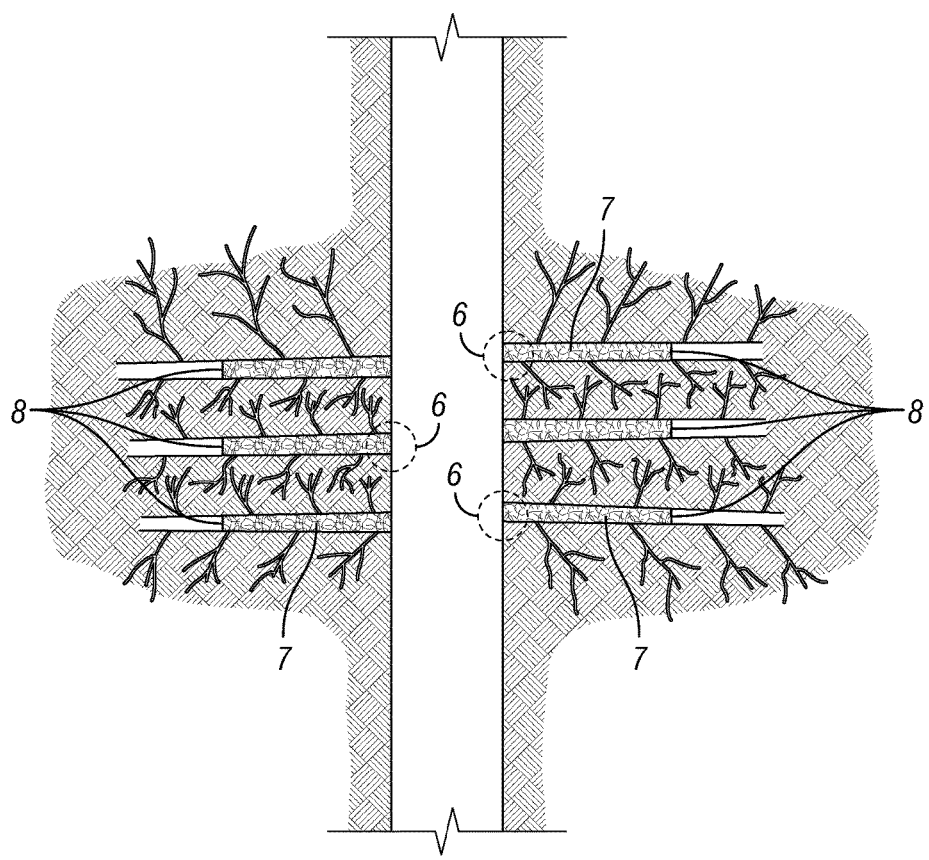
FIG. 5 is a pictorial representation of a previously stimulated zone in accordance with one or more embodiments.

Referring to FIG. 5, when the bridge is set, further accumulation of solid upstream of that point leads to plugging of a primary wormhole at a point 8 near the onset of bridging. Such a process will further result in accumulation of fibers in the primary wormhole closer and closer to the wellbore until entire primary wormholes will be filled with a dense pack of solid 7. The dense pack of solid spans from the point of onset of bridging 8 to the region of contact of the wormhole network with the wellbore. Because the permeability of the solid or fiber cake can be determined from laboratory experiments, a pressure drop through the pack 7 can be calculated at any desired time, and its influence on the fluid placement can be determined using a fluid placement simulator 142 or 242 which accounts for the reservoir and well parameters to compute the fluid placement at any time during a simulated injection of fluid.

The fluid placement simulator may compute the velocity in the wormholes, using the pump rate as an input, as well as a complete well description, formation characteristics, and wormhole geometry. As the fluid is pumped in each perforation, the fluid velocity slows down because of the pseudo radial flow around the wellbore and the leakoff of the fluid carrying the fibers in the formation. At a certain distance from the wellbore, once the fluid is slow enough and the solid loading has increased due to leakoff, the solids bridge and stop flowing. The solids then pack off in the wormhole to the perforation, where their impact on the injectivity of the formation is large. The fluid is then diverted to other zones.

In some embodiments, the concentration of solids resulting in plugging in point 8 may be in the range of 5-10000 ppt or 20-10000 ppt. Initial concentration of solids in a slurry may be in the range of 10-1000 ppt. In some embodiments, solids may be in the form of fibers.

In some embodiments, solids may be fibers with a length in the range of 1-100 mm. The fibers may be flexible or not flexible. The fibers may be degradable or non-degradable. The fibers may be made of polymer, metal, or any other organic or inorganic material.

In some embodiments, solids or fibers may be made of material that degrades within sometime after restimulation. Once solids or fibers degrade, they can be washed out of the wormholes, thus opening a previously created network of wormholes for production or injection. Degradation may occur due to interaction with formation fluid, treating fluid, injection fluid, may be triggered by changing in temperature, chemical environment, stress, pressure, pH and other parameters.

In some embodiments, fluid may be reactive with a formation or may be inert. Fluid may be acid, base or neutral. Fluid may be water-based or oil-based, polymer-based or VES based fluid. Fluid might be designed in such way that its viscosity decrease while propagating into the wormhole. Such an effect may influence plugging of a wormhole and the treatment may be designed to account for such an effect.

In some embodiments, $MAXCO_3$ acid is used as a diverter, which comprises pumping of slurry of viscoelastic acid and fibers between the stages of acid matrix treatment. The fluid may plug relatively narrow wormholes of a range 6 mm or smaller with fibers to divert fluid to under-stimulated formation and creation of new wormholes. The optimized treatment may provide for effective diversion of a treatment fluid. As a result, zones which were previously under-stimulated are treated. This may increase well productivity or injectivity in comparison with conventional acid treatments.

In some embodiments, the designed treatment is ultimately used in a subterranean formation. The subterranean formation where the treatment is used may be the same subterranean formation from which the sample was derived, or may be another subterranean formation with one or more similar characteristics to the subterranean formation from which the sample was derived. If a sample is not directly obtained from a subterranean formation, the subterranean formation where the treatment is used may be similar in some characteristics to the formation modeled in the three-dimensional model.

EXAMPLE 1

An aqueous slurry containing viscoelastic surfactant and degradable J579 fibers is to be used for isolation of a zone previously stimulated by matrix acidizing. The isolation is to occur before restimulation of the subterranean formation.

The diameter of wormholes to be plugged may be in the range of 10-25 mm and have geometrical features that will influence bridging and plugging of the fibers contained in $MAXCO_3$ Acid technology.

In order to obtain a realistic wormhole, a core sample of approximately 21 mm diameter and 110 mm in length was acidized in the laboratory with volumes equivalent to the volume of acid penetrating in the perforations during stimulation.

The core was then scanned by X ray tomography, a process which generated 2600 2-D slices of the core which were recorded in .tif files. The images were then exported to Avizo-Fire and images were processed.

The images were processed by first performing image regularization, which included filtering, segmentation with quality control procedure and subsequent analysis. Next, a .stl file was generated to prepare for three-dimensional printing. A model of the core was then printed using a commercial polyamide material.

The model was then inserted in a Swagelock pipe for bridging experiments. Bridging experiments were run by which the slurry was injected at constant rate through the model, and the pressure across the model was monitored.

The bridging experiments involved multiple experiments varying fiber concentrations of the fluids. The concentrations of fibers for each experiment were 30, 50, 100, and 150 lbs/1000 gal. For each of the fiber concentrations, experiments were run at various flow rates, ranging from 30 to 200 ml/min. Those flow rates are converted into velocity at the wormhole in m/s. The results are then plotted on a plot Y versus X, with Y=Fiber loading in lbs/1000 gal and X=velocity in m/s. The plot delimits the domain where bridging occurs versus where no bridging is observed. The fiber loading at which the bridging occurs is then correlated to the flow rate by regression from the results.

The fiber concentration can be determined by $A*v^2+B*v$, where A and B are constants, v is the velocity of the fluid at the wormhole.

This correlation is then integrated in a placement simulator, which is used to scale up the laboratory results. Such results can be used to design and optimize a treatment plan for the subterranean formation.

Although the preceding description has been described herein with reference to particular means, materials and embodiments, it is not intended to be limited to the particulars disclosed herein; rather, it extends to all functionally equivalent structures, methods and uses, such are within the scope of the appended claims.

What is claimed is:

1. A method for treating a subterranean formation, comprising:
   obtaining information of a subterranean formation;
   generating a three-dimensional model, based on the obtained information, of at least a portion of the subterranean formation, wherein the information is obtained by x-ray scanning or laser profilometry of the subterranean formation;

designing a treatment plan for the subterranean formation, wherein the designing of the treatment plan for the subterranean formation includes performing an experiment on the three-dimensional model to thereby simulate a treatment plan for the subterranean formation; and applying the treatment plan to the subterranean formation;

wherein the three-dimensional model is a printed model generated by additive manufacturing, and manipulating heterogeneities in the three-dimensional model.

2. The method according to claim 1, wherein the obtaining further comprises obtaining a core sample from the subterranean formation.

3. The method according to claim 2, wherein the core sample has previously been subjected to a fluid or condition simulating a pre-existing treatment or condition of the subterranean formation after the drilling of a wellbore penetrating the subterranean formation.

4. The method according to claim 2, wherein the obtaining further comprises performing core tests on the core sample.

5. The method according to claim 2, wherein the obtaining further comprises acidizing the core sample.

6. The method according to claim 2, wherein the obtaining further comprises fracturing the core sample.

7. The method according to claim 2, wherein the obtaining further comprises inducing heterogeneities on the core sample.

8. The method according to claim 1, wherein the subterranean formation has previously been subjected to a treatment after a drilling of the wellbore penetrating the subterranean formation.

9. The method according to claim 1, wherein the core sample is from 0.2 to 3 inches in diameter and from 0.5 to 15 inches in length.

10. The method according to claim 1, wherein the experiment is a bridging experiment.

11. A method for treating a subterranean formation, comprising:

obtaining information of a subterranean formation, wherein the obtaining information comprises x-ray scanning or laser profilometry of the subterranean formation;

generating a three-dimensional model, based on the obtained information, of at least a portion of the subterranean formation; and designing a treatment plan for the subterranean formation, wherein the designing of the treatment plan for the subterranean formation includes performing an experiment on the three-dimensional model to thereby simulate a treatment plan for the subterranean formation;

wherein the obtaining further comprises obtaining a core sample from the subterranean formation; and wherein the obtaining information further comprises scanning the core sample with an x-ray so as to create an x-ray image of the core sample; and further comprising at least one of reconstructing, segmenting and transforming the x-ray image, wherein, after the generation of the three-dimensional model, manipulating heterogeneities in the three-dimensional model; and applying the treatment plan to the subterranean formation.

12. The method according to claim 11, wherein the three-dimensional model is generated by additive manufacturing.

13. The method according to claim 11, wherein the performing the experiment further comprises obtaining relationships between velocity and fiber concentration for bridging and plugging the heterogeneities.

14. A method for treating a subterranean formation, comprising:

obtaining information of a subterranean formation;

generating a three-dimensional model of at least a portion of the subterranean formation;

designing a treatment plan for the subterranean formation, wherein the designing of the treatment plan for the subterranean formation includes performing an experiment on the three-dimensional model;

adjusting the treatment plan based upon results of the performed experiment; and applying the treatment plan to the subterranean formation;

wherein the obtaining further comprises obtaining a core sample from the subterranean formation;

wherein the core samples have previously been subjected to a fluid or condition simulating a pre-existing treatment or condition of the subterranean formation after the drilling or a wellbore penetrating the subterranean formation;

wherein the three-dimensional model is a printed model generated by additive manufacturing; and manipulating heterogeneities in the three-dimensional model.

15. The method according to claim 14, wherein the designed treatment plan includes a solid concentration of 5 pounds per thousand gallons (ppt) to 10000 ppt.

16. The method according to claim 15, wherein the solid concentration is a fiber concentration.

* * * * *